United States Patent [19]
Bunker

[11] Patent Number: 5,525,984
[45] Date of Patent: Jun. 11, 1996

[54] OPTIMIZATION OF WEIGHTED SIGNAL-TO-NOISE RATIO FOR A DIGITAL VIDEO ENCODER

[75] Inventor: Norman S. Bunker, Meriden, Conn.

[73] Assignee: ADC Telecommunications, Inc., Bloomington, Minn.

[21] Appl. No.: 102,725

[22] Filed: Aug. 6, 1993

[51] Int. Cl.$^6$ .................................................. H03M 1/20
[52] U.S. Cl. ............................................ 341/131; 348/574
[58] Field of Search ................................. 341/131, 144, 341/155, 126, 110; 348/574; 358/457

[56] References Cited

U.S. PATENT DOCUMENTS

| | | | |
|---|---|---|---|
| 3,704,948 | 12/1972 | Browning | 341/131 |
| 3,860,953 | 1/1975 | Cutler et al. | |
| 3,999,129 | 12/1976 | Kasson | 325/42 |
| 4,187,466 | 2/1980 | Kasson et al. | 325/42 |
| 4,352,123 | 9/1982 | Flamm | |
| 4,543,599 | 9/1985 | Willis et al. | |
| 4,647,968 | 3/1987 | Willis | |
| 4,661,861 | 4/1987 | Rutherford et al. | |
| 4,791,483 | 12/1988 | Miller | |
| 4,825,286 | 4/1989 | Graves | |
| 4,831,464 | 5/1989 | Chijiwa | 341/131 |
| 4,868,653 | 9/1989 | Golin et al. | |
| 4,918,540 | 4/1990 | Ohtani | |
| 4,937,576 | 6/1990 | Yoshio et al. | 341/131 |
| 4,968,967 | 11/1990 | Naka et al. | 341/131 |
| 5,012,242 | 4/1991 | Yoshio et al. | 341/131 |
| 5,073,778 | 12/1991 | Ueki et al. | |
| 5,144,308 | 9/1992 | Norsworthy | 341/131 |
| 5,451,947 | 9/1995 | Morrison | 341/131 |

FOREIGN PATENT DOCUMENTS

| | | |
|---|---|---|
| 0184398 | 6/1986 | European Pat. Off. |
| 0543220A1 | 5/1993 | European Pat. Off. |
| 3-283822 | 12/1991 | Japan |

OTHER PUBLICATIONS

Paper presented at 42nd Annual NCTA Convention and Exposition on Jun. 6–9, 1993 in San Francisco, California entitled *Quantifying Video Performance in Uncompressed and Compressed Digital Systems used for Regionwide CATV Fiber Networks* by John Holobinko, Vice President, Marketing and Strategic Planning and Norman Bunker, Director of Advanced Development.

Eisenson, Direct Digital Synthesis, Microwave Engineering Europe, Sep. 1990, pp. 33–49.

*Primary Examiner*—Howard L. Williams
*Attorney, Agent, or Firm*—Schwegman, Lundberg, Woessner & Kluth

[57] ABSTRACT

When processing video television information the low frequency band is inherently of primary interest due to the natural averaging properties of the human eye, combined with the limited frequency response of video display elements such as phosphorus and liquid crystal displays. Noise is generated and observed in the low frequency region of digitized analog video signals due to nonlinearities inherent in the digitization process. This invention reduces the noise measured in the low frequency region by shifting the noise upband and out of the frequencies of interest by adding a dither signal to the analog input signal and employing a 2X decimation digital filter to remove the unwanted dither and spurious intermodulation signals. The disclosed invention allows for a simple and inexpensive means for removal of the dither signal without having to resort to complex dither subtraction techniques employed in the prior art.

11 Claims, 3 Drawing Sheets

OPTIMIZATION OF WEIGHTED SIGNAL-TO-NOISE RATIO FOR A DIGITAL VIDEO ENCODER

TECHNICAL FIELD OF THE INVENTION

The present invention pertains generally to analog-to-digital conversion of video signals, and more particularly to a linear pulse-code modulated (PCM) digital video encoder conforming to advanced standards such as T1Q1.5190-205R4 Digital Transport of System M-NTSC Television Signals-Analog Interface Specifications and Performance Parameters.

BACKGROUND OF THE INVENTION

Video television signals are now commonly transported over fiber optic lines in a digital format. This requires the use of high speed analog-to-digital converters to convert the source analog signal to a digital form. The present invention addresses two inadequacies observed in currently available integrated circuits for high speed digitization of an analog video signal. In these A/D circuits, the noise spectral density, rather than being white, shows low frequency peaking, and the total noise integrated over a passband of the sampling range ($f_{sample}/2$) is increased significantly from the theoretical value (1 quantization step size divided by the square root of 12) as the sampling rate is increased. This increased low frequency noise, above a certain level, is visible in the displayed video signal, and therefore highly undesirable. As a result, it is an obstacle to employing advantageous two-times (2X) decimation digital filtering of the digitized video signal, because such filtering requires a doubling of standard sampling rates (which range from 10.7 to 22 MHz, such as 13.5 MHz as specified by CCIR Req. 601 and 14.3 MHz as specified by SMPTE244M, for systems employing 4X color subcarrier phase-locked sampling) and a corresponding unacceptable increase in visible noise in the displayed video signal. 2X decimation filtering is advantageous because it relaxes the requirements for expensive Nyquist low-pass filtering to prevent aliasing components with the attendant amplitude ripple and group delay contribution.

SUMMARY OF THE INVENTION

The present invention describes a method and system for improving the CCIR weighted video signal-to-noise ratio of the analog-to-digital process used in a linear PCM digital video encoder. According to one aspect of the invention, a sine wave or narrow band noise is added to the incoming base band video signal of sufficient magnitude to produce two least-significant bits of dither in the A/D converter. This results in the dispersal of low frequency noise components into the higher frequencies, where they are less visible in the displayed video signal. Since standard measurement techniques weight low frequency noise components greater than high frequency components in the video signal (due to the relative visibilities of such noise in the displayed signal), there is an effective increase in the signal-to-noise ratio of the video signal.

According to another aspect of the invention, the system employs 2X decimation digital filtering to simply and inexpensively produce a desirable increase in signal-to-noise ratio without having to employ difficult subtraction routines and expensive filters.

The present invention thus derives optimum performance from available flash A/D converters operating at elevated sampling rates when measurement of video signal-to-noise ratio is made in accordance with international standards employing dynamic test signals designed specifically to exercise a digital transmission channel (e.g., shallow ramp test signals).

DETAILED DESCRIPTION OF THE INVENTION

In the following detailed description of the preferred embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Figure 1:
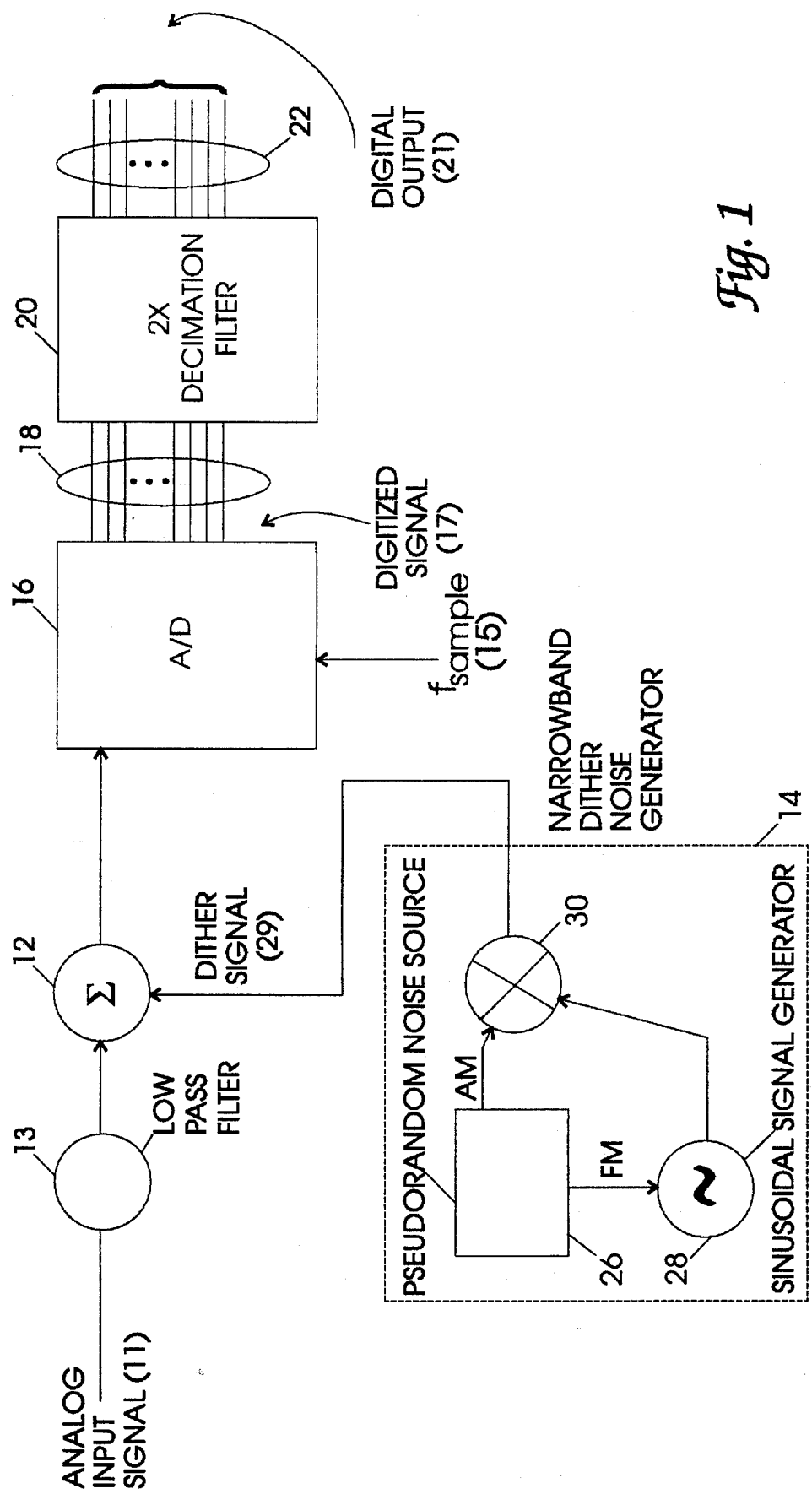
FIG. 1 is a block diagram of a digital video encoder analog-to-digital converter using a two-times (2X) decimation filter.

Referring now to FIG. 1, there is shown a simplified block diagram of a system for analog-to-digital conversion and digital filtering of a low pass filtered analog video input signal according to the present invention. System 10 includes a low pass filter 13 and a summing amplifier 12 receiving a filtered analog video input signal 11 and an input signal 29 from the narrowband dither noise circuit 14. The output of amplifier 12 is applied to the analog-to-digital (A/D) converter 16, which in turn produces a digitally encoded signal 17 on outputs 18. The A/D converter converts at a frequency $f_{sample}$ 15. The digitized signal 17 is applied to 2X decimation filter 20, which produces a digital output signal 21 on lines 22. Narrowband dither noise circuit 14 includes a pseudorandom noise generator 26 (of conventional construction) producing filtered pseudorandom noise signals, a voltage variable frequency generator 28 for generating a sinusoidal FM signal of 600 KHz peak-to-peak deviation, and a voltage controlled amplifier (VCA, m=0.5) 30 combining the signals and outputting the combined signal 29 to summing amplifier 12.

The pseudorandom noise sequence generator 26 produces control signals which operate on the frequency and amplitude of what would otherwise be a spectrally pure continuous sine wave produced by generator 28.

In operation, the narrow-band dither noise 29 is summed with the analog input signal in amplifier 12 and injected into the A/D converter 16. The resulting digitized output signal 17 contains the narrow-band dither noise 29 summed with the analog input signal 11. The output signal 17 is filtered by 2X decimation filter 20. Filter 20 preferably has a cut-off frequency, $f_{cutoff}$, equal to $f_{sample} \times 0.22$, where $f_{sample}$ is the sampling frequency of the A/D converter 16. The resulting digital output signal 21 has the characteristics of a symmetrical 55 tap FIR digital filter with even order coefficients of value 0 except for #28 which equals 0.5009766. The use of a 2X decimation digital filter requires that the sampling frequency of the A/D process be twice the output line sampling frequency (the effective sampling rate required of the digitized output) to compensate for the decimation of every other sample. Standard sampling rates are 13.5 MHz as specified by CCIR Req. 601 and 14.3 MHz as specified by SMPTE244M, for systems employing 4X color subcarrier phase-locked sampling; however, nonstandard sampling rates are also used, for example, for multichannel applications.

The digital output signal obtained by the use of dither signal 29 and the 2X decimation filter 20 results in an improvement in signal-to-noise ratio when compared to simply injecting the analog input signal 11 into the A/D converter 16, because the low frequency noise components are dispersed by the dither injection, resulting in a greater signal-to-noise ratio in the frequency region of interest.

The advantages of using a 2X decimation digital filter 20 include a relatively sharp attenuation filter profile and an inexpensive filter realization. For proper operation of the system the dither signal frequency and any spurious intermodulation products must fall outside the passband of the 2X decimation filter. The resulting benefit is that the dither signal is stripped out of the converted signal 17 by the 2X decimation digital filter 20 and need not be subtracted from the resulting digital representation.

Figure 2:
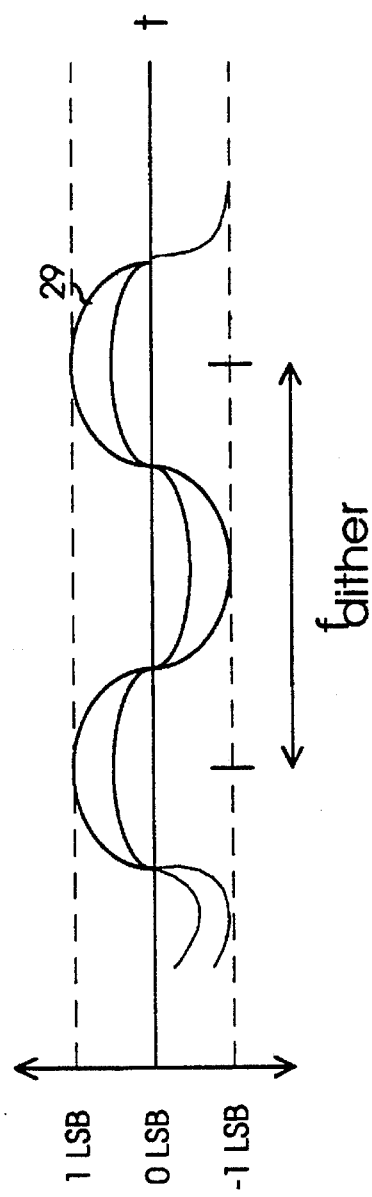
FIG. 2 shows a narrow band dither noise signal in units of quantization of the analog-to-digital converter.

The center frequency of the dither signal 29 is chosen such that the intermodulation products between the sampling clock or color subcarriers (NTSC: 3.58 MHz; PAL: 4.43 MHz) and the dither signal 29 fall outside the passband of the measurement bandwidth for signal-to-noise ratio as specified by standards. Failure to satisfy this constraint can lead to aliasing products for systems not employing 2X oversampling. In signal-to-noise measurement techniques specified by North American NTSC and European PAL standards, the low frequencies (750 KHz or less) are weighted most heavily when employing a 5 IRE shallow ramp test signal in conjunction with the 5 MHz low pass filter and CCIR unified weighting networks. The present invention uses a dither signal of nominal center frequency equal to 9.46 MHz. This results in the dispersal of low frequency noise components (less than 750 KHz) into higher frequencies. FIG. 2 shows the dither signal 29 used in the present invention. As illustrated, the dither signal 29 has a peak-to-peak amplitude equal to at least two quantization levels of the A/D converter 16.

The use of 2X decimation digital filtering obviates the need to use expensive Nyquist low pass filters to prevent aliasing components. The drawbacks of employing low pass filters with sharp filter profiles is the attendant amplitude ripple and group delay contribution. 2X decimation filters are readily available, and less expensive than sharp Nyquist low pass filters. Flash A/D converters are employed preferably due to their ready availability and relative low cost.

Figure 3:
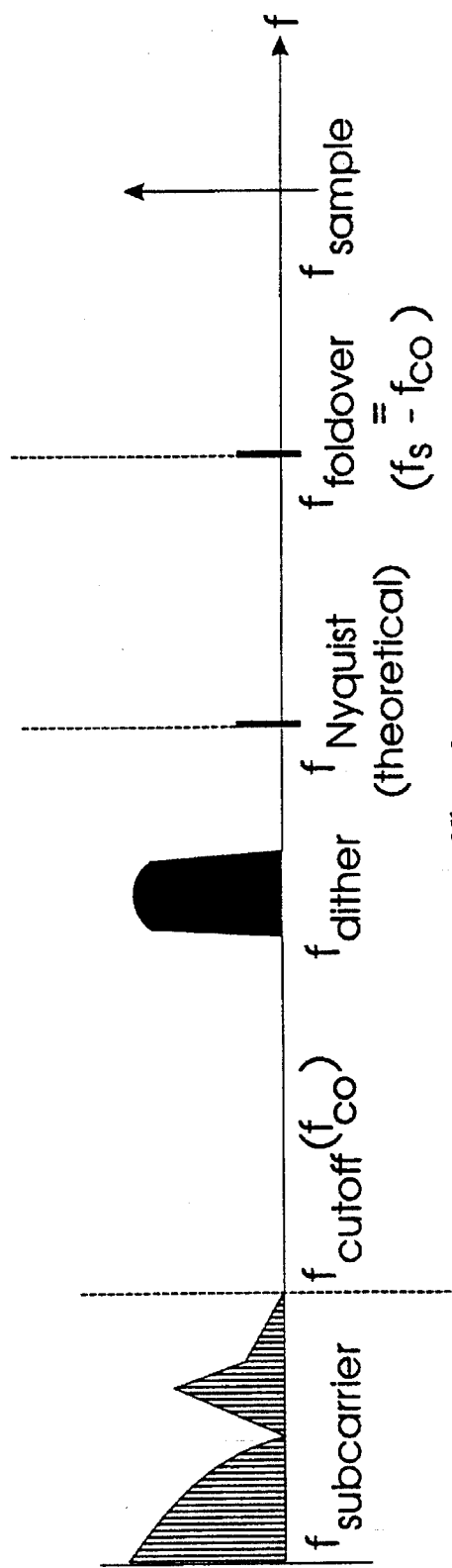
FIG. 3 shows a frequency spectrum of the present invention, including dither center band frequency, sampling frequency and color subcarrier frequencies.

Employing the 2X decimation digital filter 20 results in a 5 dB increase in the signal-to-noise ratio of the resulting digital conversion when using a sampling frequency, $f_{sample}$, of 27 MHZ, a digital filter 20 having a cutoff frequency of 0.22 times the sampling frequency, $f_{sample}$, and a dither amplitude of two least-significant bits. FIG. 3 illustrates the relative frequencies of $f_{cutoff}$, the dither signal ($f_{dither}$), the Nyquist frequency ($f_{Nyquist}$), and $f_{sample}$. As illustrated, all dither and intermodulation products lie outside of the passband of the 2X decimation filter 20 and the specified passband for signal to periodic noise ratio per EIA standard RS250C.

The system of the present invention also has the effect of increasing the maximum achievable resolution of the A/D converter as expressed in equivalent number of bits (ENOB). More specifically, weighted video signal theory predicts that the signal-to-noise ratio for a weighted video signal for an A/D converter is $6.02 \times n + 10.7 + \log(f_{sample}/8MHz)$ decibels (dB), where n is the number of bits of resolution of the A/D converter. The measured ENOB for an undithered 8 bit A/D converter system with 27 MHz sampling rate is 6.5 bits for a shallow ramp test signal input, which is equivalent to 55 dB. However, the ENOB is 7.3, or 59.7 dB when the dither signal is added to the system, which is much closer to the vendor specified performance as derived from fast Fourier transform (FFT) measurement techniques employing unpredictable continuous sine wave digitization.

The pseudorandom noise generator 26 of the present invention is not necessary to obtain the noise shifting characteristics and operation of the invention, and therefore may be omitted from the circuit. The noise generator 26 is employed solely for the purpose of randomizing the vestigial harmonic components arising from the sinusoidal component of the dither signal mixing with sinusoidal components of the analog input signal or the sampling clock. This feature is included in the system substantially to achieve conformance to EIA standard RS250C specifications for signal to periodic noise and reduce spurious levels below the industry accepted "W" curve levels for subjective visibility of spurious interfering products.

Figure 4:
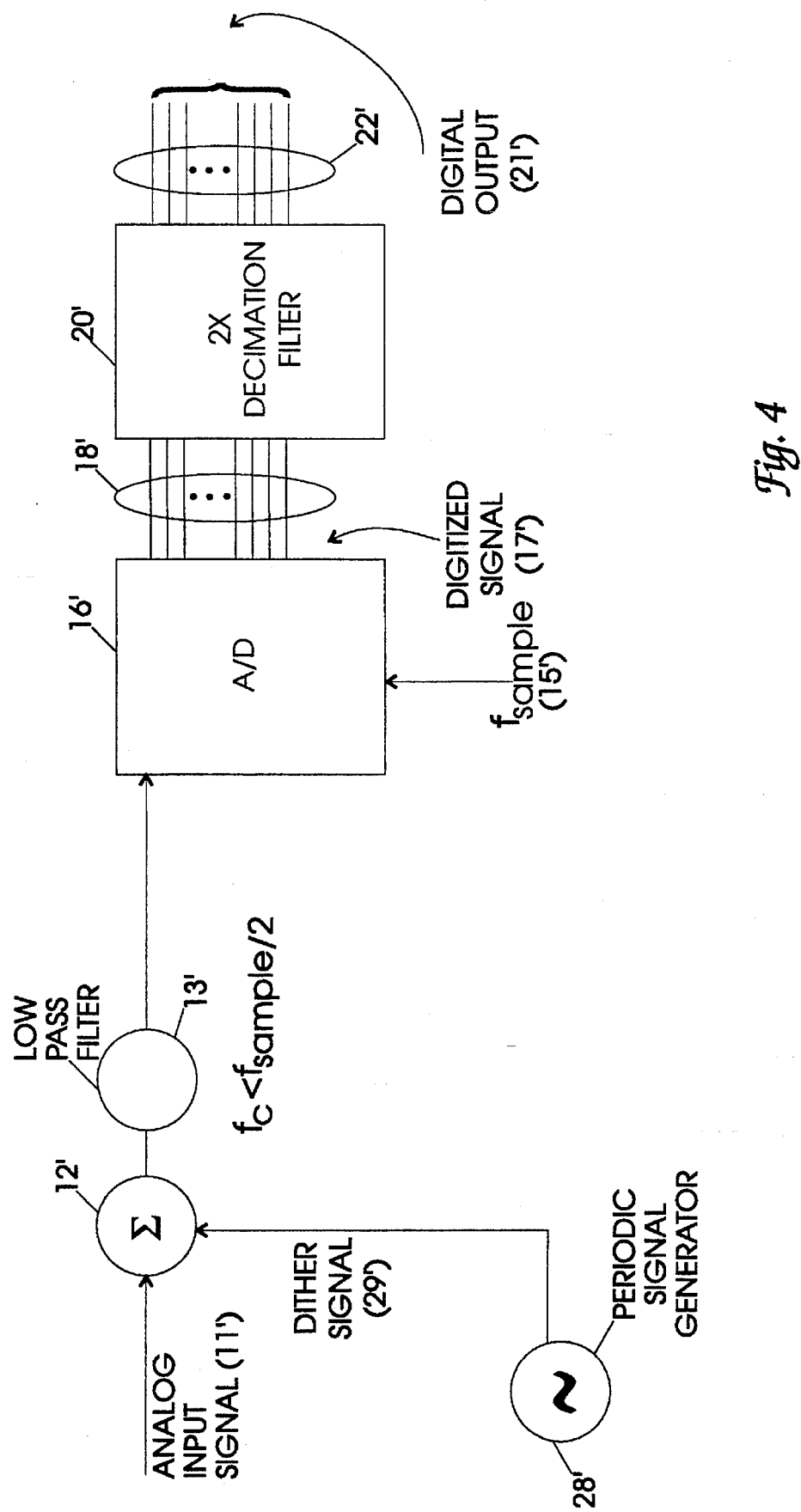
FIG. 4 shows a block diagram of a digital video encoder analog-to-digital converter using a sinusoidal dither signal source and a two-times (2X) decimation filter.

Accordingly, an alternate embodiment of the present invention is shown in FIG. 4 which illustrates the system utilizing a purely periodic or sinusoidal dither signal source 28, summed with the analog input signal in front of low pass filter 13'. The elements of FIG. 4 are labeled with primed like-referenced numerals to FIG. 1. The alternate point of summation also works with the randomized dither signal 29 generated by circuit 14. Similarly, the periodic signal generated by generator 28 may be summed with the analog input signal at the point shown in FIG. 1. It is contemplated that other signals of different forms may also work. Also, as used herein, the term "narrowband noise signal" refers to a sinusoidal signal, a randomized sinusoid, or equivalents.

Thus, there has been described above a system and method for obtaining optimum performance from available flash A/D converters operating at elevated sampling rates when measurement of video signal-to-noise ratio is made in accordance with international standards.

What is claimed is:

1. A system for digitizing an analog video signal, comprising:

(a) a narrowband dither noise generator producing a narrowband dither noise signal having a periodic component:

(b) a summing circuit receiving an analog video signal and the narrowband dither noise signal and producing a combined signal comprising a dithered video signal;

(c) an analog-to-digital (A/D) converter receiving the dithered video signal and producing a corresponding digital signal; and (d) a signal filter receiving the digital signal to produce a filtered signal, said filter having a passband, said periodic component falling outside of said passband;

wherein the narrowband dither noise generator comprises;

(1) a sinusoidal signal generator producing a sinusoidal signal which serves as a center frequency for the narrowband dither noise signal wherein the sinusoidal signal frequency is less than the Nyquist frequency of the analog to digital converter but selected such that any intermodulation products generated by a summation of the sinusoidal signal and the analog video signal fall outside of the passband of the signal filter;

(2) a pseudorandom noise circuit producing a randomizing signal; and (3) a circuit means for randomizing the sinusoidal signal using the randomizing signal and producing the narrowband dither noise signal.

2. The system set forth in claim 1 wherein the narrowband dither noise signal has an amplitude which dithers the input into the analog-to-digital converter at a peak-to-peak amplitude of at least two quantization levels of the analog-to-digital converter.

3. The system set forth in claim 1 wherein the signal filter is a 2X decimation digital filter.

4. The system of claim 1 wherein the sinusoidal signal produced by the sinusoidal signal generator is selected such that the narrowband dither noise signal and any intermodulation products arising from the combination of (1) said narrowband dither noise signal and the analog input signal and (2) said narrowband dither noise signal and an analog-to-digital converter sampling signal occur outside of the passband of the signal filter.

5. An analog-to-digital conversion system, comprising:

a pseudorandom noise signal source producing a pseudorandom noise signal;

a dither signal source producing a dither signal;

a circuit for combining the pseudorandom noise signal and the dither signal to create a randomized periodic dither signal which is both amplitude and frequency modulated by the pseudorandom noise signal:

a summing circuit for combining an input signal and the randomized periodic dither signal to produce a dithered input signal;

an analog-to-digital converter, receiving the dithered input signal and producing a digitized output signal; and a digital filter receiving the digitized output signal and removing the randomized periodic dither signal from the digitized output signal.

6. The system of claim 5 wherein the randomized periodic dither signal has an amplitude modulation which is less than fifty percent and a frequency modulation which is less than ten percent of the center frequency of the randomized periodic dither signal.

7. A method for reducing the visibility of intermodulation products produced in a dithered discrete sampling analog-to-digital conversion system comprising the steps of:

(a) providing a pseudorandom noise signal;

(b) providing a dither signal;

(c) combining the pseudorandom noise signal with the dither signal such that the dither signal is both amplitude and frequency modulated by said pseudorandom noise signal;

(d) applying the amplitude modulated and frequency modulated dither signal to an analog-to-digital converter; and (e) filtering the digitized output from the analog-to-digital converter.

8. A method for reducing visible noise in a video signal transported in a digital form, comprising the steps of:

(a) providing an analog-to-digital converter having a plurality of quantization levels;

(b) dithering the video signal with a dither signal having a peak-to-peak amplitude of at least two quantization levels of the analog-to-digital converter, the step of dithering the video signal including the step of amplitude and frequency modulating a periodic signal to produce the dither signal (c) applying the dithered video signal to the analog-to-digital converter resulting in a digitized signal; and (d) selecting the dither frequency to cause low frequency noise in the video signal to be displaced upband to improve the signal-to-noise ratio in a desired frequency region of the digitized signal.

9. The method of claim 8 further including the step of filtering the digitized signal to remove frequencies above a cutoff frequency.

10. The method of claim 9 wherein the filtering is accomplished with a 2X digital decimation filter.

11. The method of claim 8 wherein the step of dithering the video signal includes the steps of: generating the dither signal; and adding the dither signal to the video signal.

* * * * *

UNITED STATES PATENT AND TRADEMARK OFFICE
CERTIFICATE OF CORRECTION

PATENT NO. : 5,525,984
DATED : June 11, 1996
INVENTOR(S) : Norman S. Bunker

It is certified that error appears in the above-identified patent and that said Letters Patent is hereby corrected as shown below:

Column 4, line 50-51, delete "component:" and insert therefor —component;—.

Column 4, line 62, delete "comprises;" and insert therefor —comprises:—.

Column 4, line 65, after "signal" insert —,—.

Column 5, line 33, delete "signal:" and insert therefor —signal;—.

Column 6, line 28, after "signal" insert —;—.

Signed and Sealed this

Seventh Day of January, 1997

Attest:

BRUCE LEHMAN

Attesting Officer

Commissioner of Patents and Trademarks